(12) United States Patent
Smith

(10) Patent No.: US 8,138,778 B1
(45) Date of Patent: Mar. 20, 2012

(54) APPARATUS FOR HIGH DENSITY LOW COST AUTOMATIC TEST APPLICATIONS

(75) Inventor: Stephen William Smith, San Jose, CA (US)

(73) Assignee: Stephen William Smith, Santa Cruz, CA (US)

( * ) Notice: Subject to any disclaimer, the term of this patent is extended or adjusted under 35 U.S.C. 154(b) by 66 days.

(21) Appl. No.: 11/394,580

(22) Filed: Mar. 30, 2006

Related U.S. Application Data

(60) Provisional application No. 60/666,601, filed on Mar. 31, 2005.

(51) Int. Cl.
*G01R 31/00* (2006.01)

(52) U.S. Cl. .................................. 324/756.02

(58) Field of Classification Search .................. None
See application file for complete search history.

(56) References Cited

U.S. PATENT DOCUMENTS

| | | | |
|---|---|---|---|
| 5,001,422 A * | 3/1991 | Dahlberg et al. | 324/756.05 |
| 5,986,458 A * | 11/1999 | Saito et al. | 324/756.05 |
| 6,163,464 A * | 12/2000 | Ishibashi et al. | 361/788 |
| 6,462,532 B1 * | 10/2002 | Smith | 324/158.1 |
| 6,640,273 B1 * | 10/2003 | Spisak et al. | 710/104 |
| 6,700,396 B1 * | 3/2004 | Smith et al. | 324/754 |
| 6,956,379 B2 * | 10/2005 | Mastoris et al. | 324/538 |
| 6,975,130 B2 * | 12/2005 | Yevmenenko | 324/765 |
| 6,989,902 B2 * | 1/2006 | Mailaender et al. | 356/477 |
| 6,995,578 B2 * | 2/2006 | Shibuya et al. | 324/756.07 |
| 7,138,733 B2 * | 11/2006 | Sanders et al. | 307/147 |
| 7,272,774 B2 * | 9/2007 | Co et al. | 714/764 |
| 7,348,786 B2 * | 3/2008 | Thacker et al. | 324/755.07 |
| 7,362,089 B2 * | 4/2008 | Kushnick et al. | 324/158.1 |

* cited by examiner

*Primary Examiner* — Roberto Velez

(57) ABSTRACT

An apparatus for testing radio frequency (RF) and/or mixed signal semiconductor devices and or modules is described. specifically described is how the distributed stimulus for RF automatic test applications, unified testhead for automatic test applications, reverse card backplane for automatic test applications, direct coaxial interface for automatic test applications, cable-free interface for automatic test applications, micromachine switch matrix for automatic test applications, device specific module high speed date for RF automatic test applications may be used within tester apparatus described herein or in other test applications. Additionally a high speed date communications test apparatus which may be used in a variety of device testers is described herein.

20 Claims, 19 Drawing Sheets

APPARATUS FOR HIGH DENSITY LOW COST AUTOMATIC TEST APPLICATIONS

CROSS-REFERENCE TO RELATED INVENTIONS

I claim the benefit of the following provisional patents:

Appl No. 60/666,601, filed Mar. 31, 2005:—distributed stimulus for RF automatic test applications, unified testhead for automatic test applications, reverse card backplane for automatic test applications, cable-free RF signal path for automatic test applications, micromachine RF matrix for RF automatic test applications, device specific module for RF automatic test applications.

FIELD OF THE INVENTION

The field of the invention relates to automatic test equipment, and more specifically to an apparatus and to novel techniques used therein for the purpose of testing semiconductor devices and/or modules.

BACKGROUND

Semiconductor devices or modules are often tested using automatic test equipment (ATE). Generally, the tester includes a computer system that coordinates and runs the tests, and a testing apparatus. Typically testers are costly, bulky machines consuming vast amounts of power, taking large amounts of space on a test floor, requiring expensive cooling techniques and using restrictive proprietary backplane architectures which are costly to develop and prevent instruments from other manufacturers being employed. Further current testers have limited signal integrity due to the electrical length and parasitic capacitances introduced by cabling between the test instruments and the device under test (DUT). Further testers capable of parallel testing are now available but are extremely costly, and at present no tester exists that is capable of testing high speed date communication devices with programmable jitter injection at date-rates above 5 gigabits per second.

The invention described herein is a semiconductor integrated circuit/module tester which can address all of these issues. The distributed stimulus for RF automatic test applications reduces the cost of test and enables greater test flexibility and provides an economical way to test devices with multiple RF ports perform parallel device testing. The unified testhead for automatic test applications overcomes the problem of testers being so bulky and costly by building the entire tester into one assembly using a standard backplane architecture such as PXI, VXI, or VME so that ofd shelf modules may be used and the entire tester can mate directly it a prober—handler effectively taking zero tester floor space. The problem of being limited to proprietary backplanes in the tester is overcome by the reverse card backplane for automatic test applications leveraging existing backplane technology such as PXI, VXI, or VME while still providing both front and back access to test boards/modules enabling better signal integrity and shorter electrical lengths when connecting to the device under test (DUT). The problem of RF cable lengths between the test instrumentation and the DUT is further overcome by the direct coaxial interface for automatic test applications and provides a further way of shortening the electrical path length thus improving signal quality when connecting to the device under test (DUT). Likewise for signal paths not using coaxial connectors the cable-free interface for automatic test applications provides another way of shortening the electrical, optical or magnetic path to improve signal quality when connecting to the device under test (DUT). The problem of testers either being bulky or not flexible is further overcome by the micromachine switch matrix for automatic test applications provides greater flexibility in tester configuration without degrading signal integrity, The problem of parallel test being costly is overcome by the device specific module for RF automatic test applications makes it possible to perform low cost parallel testing of multiple device families. The problem of not being able to test high speed date communications devices at date rates above 5 gigabits per second with programmable jitter and levels is overcome by the high speed date communications test apparatus. The problem of power consumption and high cooling cost is overcome by using a flexible open architecture with power-efficient circuitry and reduced electrical losses due to the reverse card backplane, direct coaxial interface and cable free interface requiring less power to achieve comparable signal integrity and a scalable architecture making it only necessary to populate the tester to the level required.

SUMMARY AND OBJECTS OF THE INVENTION

It is an object of this invention to provide an apparatus to test radio frequency (RF) and/or mixed signal semiconductor devices and or modules. specifically this invention incorporates a number of ingenious concepts which may be used as a part of the tester described herein, but may also be used in other test applications. Because the test apparatus described has a modular construction it may comprise all or any combination of the inventions described herein. One of the inventions described that may form a part of this tester is the distributed stimulus for RF automatic test applications which enables greater test flexibility and provides an economical way to preform parallel device testing thus reducing cost of test by permitting one signal source to be used as a reference for a multiplicity of device test ports.

The unified testhead for automatic test applications enables the entire tester to be built in one assembly if so desired reducing the floor space required by the tester. This is a significant improvement on existing testers which are either very large and bulky and so take up a lot of floorspace, or are very small with a very limited test capability.

The reverse card backplane for automatic test applications is a method of leveraging existing backplane technology while still providing both front and back access to test boards/modules enabling better signal integrity and shorter electrical lengths when connecting to the device under test (DUT). Prior art approaches require lengthy cables thus degrading performance.

The direct coaxial interface for automatic test applications provides a further way of shortening the electrical path thus improving signal quality when connecting to the DUT. Prior art approaches comprise lengthy cable runs between the testt instrumentation and the DUT.

The cable-free interface for automatic test applications provides a way of shortening the electrical, optical or magnetic path to improve signal quality when connecting to the DUT. Again this provides a significant reduction in electrical or optical cabling compared to prior art.

The micromachine switch matrix for automatic test applications provides greater flexibility in tester configuration without degrading signal integrity, prior artapproaches have used co-axial relays which are expensive, bulky and require co-axial cables which degrade signal performance. The device specific module for RF automatic test applications makes it possible to perform low cost parallel testing of multiple types of radio frequency (RF) devices. The prior art approach has been to have separate test instrumentation for each device(s) or family of devices being tested. The high speed datacommunications test apparatus enables testing of high speed data communication devices at a wide range of date rates especially those above 5 gigabits per second. The prior art approach has been to use loopack test of two devices. Additionally the embodiment of the high density low cost test apparatus employing any combination of the inventions described here can use a standard open-architecture, such as PXI, VXI or VME, while still providing a high signal integrity, flexibility and at a considerably lower cost and smaller physical size than prior art approaches.

BRIEF DESCRIPTION OF DRAWINGS

The present inventions are illustrated by way of example and not by way of limitation, in the figures of the accompanying drawings and in which like reference numerals refer to similar elements and in which:

FIG. 7 3D Drawing of unified Testhead (rear view)

DETAILED DESCRIPTION

The distributed stimulus which provides much more test flexibility than prior art permitting signal generators to be combined to produce multiple tones, routed separately to the device Under test (DUT), or combined with an internal calibrated noise source thereby giving multiple signal ports rather than being limited by the prior art approach of having separate combined or non-combined DUT ports with limited test capability.

Figure 1:
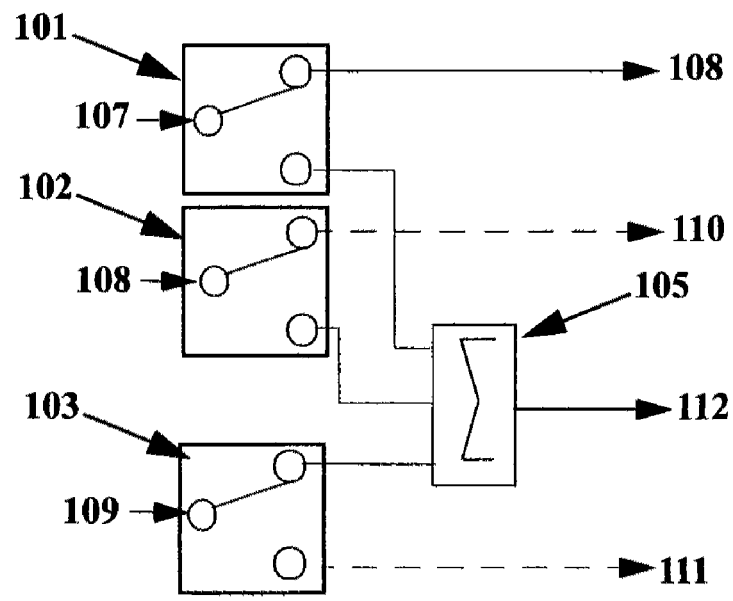
FIG. 1 Block Diagram showing one example of the distributed stimulus used in tester.

FIG. 1 is a block diagram showing an example of a basic distributed stimulus. In this example three input signals 107, 108 and 109 are shown. Input signal 107 is routed to RF switch 101 where it may be switched to DUT port 108 or via combiner 105 to DUT port 112. Likewise Input signal 108 is routed to RF switch 101 where it may be switched to DUT port 110 or combiner 105 to DUT port 112. If both switches are set to combiner 105 then the two incoming sources are combined thereby producing a two-tone signal at DUT port 112 which can be used for wireless, video or audio testing. Additionally an optional third input signal 109 could be applied via switch 103 to either DUT port 111 or via combiner 105 to DUT port 112 thereby producing a triple tone output for special RF or other testing at DUT port 112.

Figure 2:
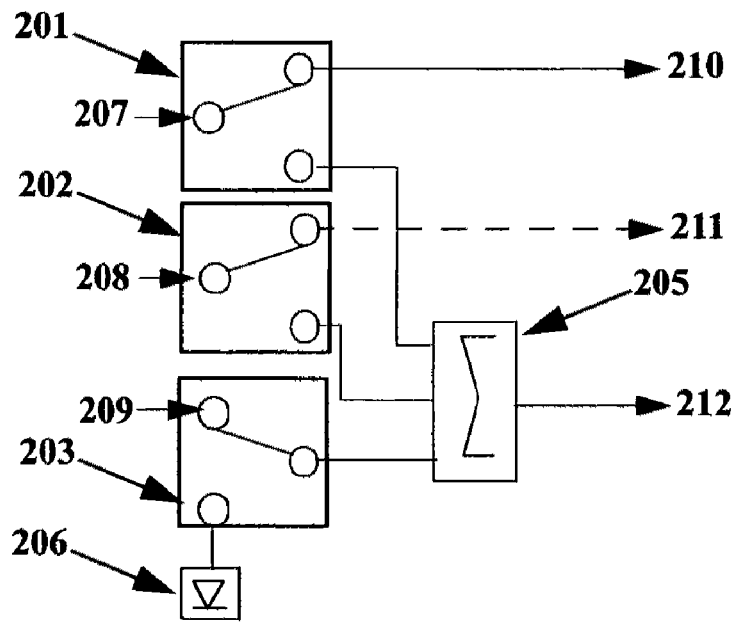
FIG. 2 Diagram showing example of noise injection to the distributed stimulus port used in tester.

FIG. 2 is another possible variation on the distributed stimulus, where switch 203 is used to select between signal input 209 and an on-board noise source 206. The output of this switch is fed to radio frequency (RF) combiner 205 where it may be combined with signal source 207 via switch 201, and/or signal source 208 via switch 202 respectively and routed to DUT port 212. In this instance signal source 207 may also be routed to auxiliary DUT port 210 via switch 201. Likewise signal source 208 may also be routed to auxiliary DUT port 211 via switch 201.

Figure 3:
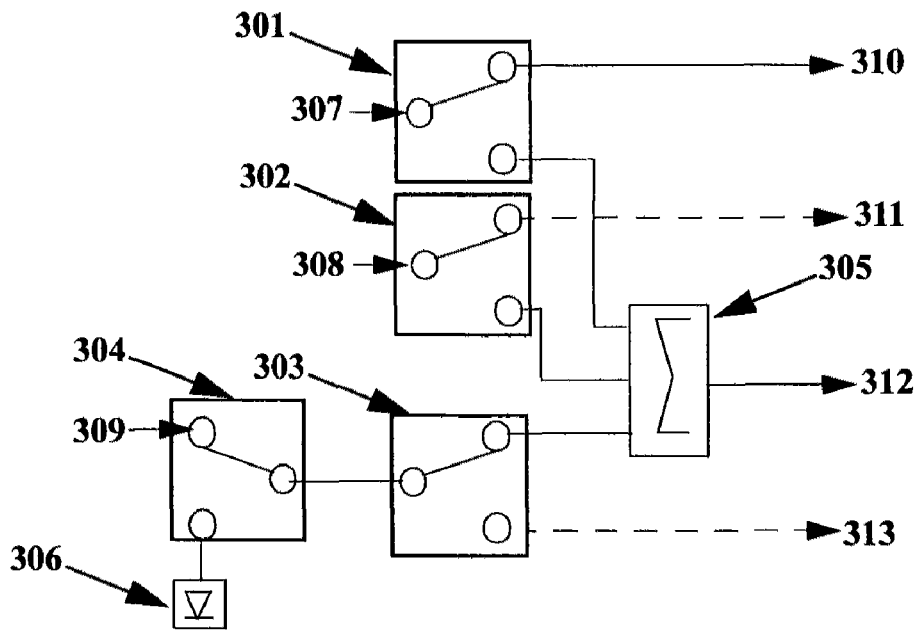
FIG. 3 Diagram showing variation of noise injection to the distributed stimulus port used in tester.

FIG. 3 shows a further variation of this distributed stimulus concept, here input 309 or the noise diode 306 is selected by switch 304, this is then connected to switch 303 which enables this signal to be either fed to the auxiliary device under test (DUT) output 313, or via combiner 305 where it may be combined with signal source 307 via switch 301, and/or signal source 308 via switch 302 respectively and routed to DUT port 312. In this instance signal source 307 may also be routed to auxiliary DUT port 310 via switch 301. Likewise signal source 308 may also be routed to auxiliary DUT port 311 via switch 301.

Figure 4:
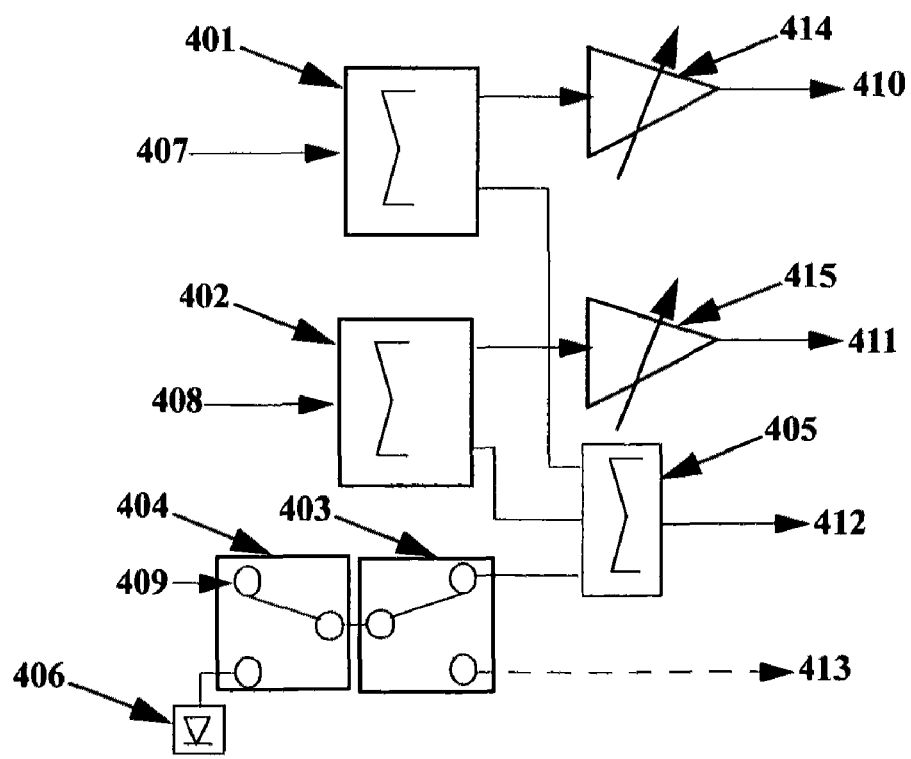
FIG. 4 Diagram showing example of gain variation to the distributed stimulus port used in tester FIG. 5 Drawing showing example of unified testhead with external computer.

FIG. 4 shows a further possible variation of this distributed stimulus concept, here the signal source 409 or the noise diode 406 is selected by switch 404, this is then connected to switch 403 which enables this signal to be either fed to the auxiliary device under test (DUT) port 413, or via combiner 405 where it may be combined with signal source 407 via switch 401, and/or signal source 408 via switch 402 respectively and routed to DUT port 412. In this instance how ever signal source 407 may also be routed to amplifier 414. The amplified signal is then fed to auxiliary DUT port 410. Likewise signal source 408 may also be routed to amplifier 415. The amplified signal is then fed to auxiliary DUT port 411. The amplifiers 414 and 415 may either be fixed gain, fixed gain with variable attenuator or variable gain. If the amplifier is a variable gain or variable attenuator type then this may be used to set the signal levels during calibration.

The unified testhead is a new way of testing RF modules and components because it offers essentially the full featured multi-channel capabilities of a prior art tester but without the need for a cumbersome floor-mounted enclosure to hold the RF instruments, cooling, and power supplies. There are many prior-art 19" rack-mounted instruments available which have been capable of performing tests and which use a single row of PXI (or other architecture) instruments, but these have limited capabilities both in the number of available PXI slots (18 maximum), long RF/cables which limit the resolution of RF and high speed digital measurements. The unified testhead tester by contrast may have input and output connections on both the front and rear enabling far greater ease of use and integration into prober/handler or pick and place environments. There are also prior-art non-RF semiconductor testers which are self-contained, however because the available RF signal sources up until now have been 19" rack instruments it has not possible to produce a tester capable of supporting RF test using the unified testhead concept.

Figure 5:
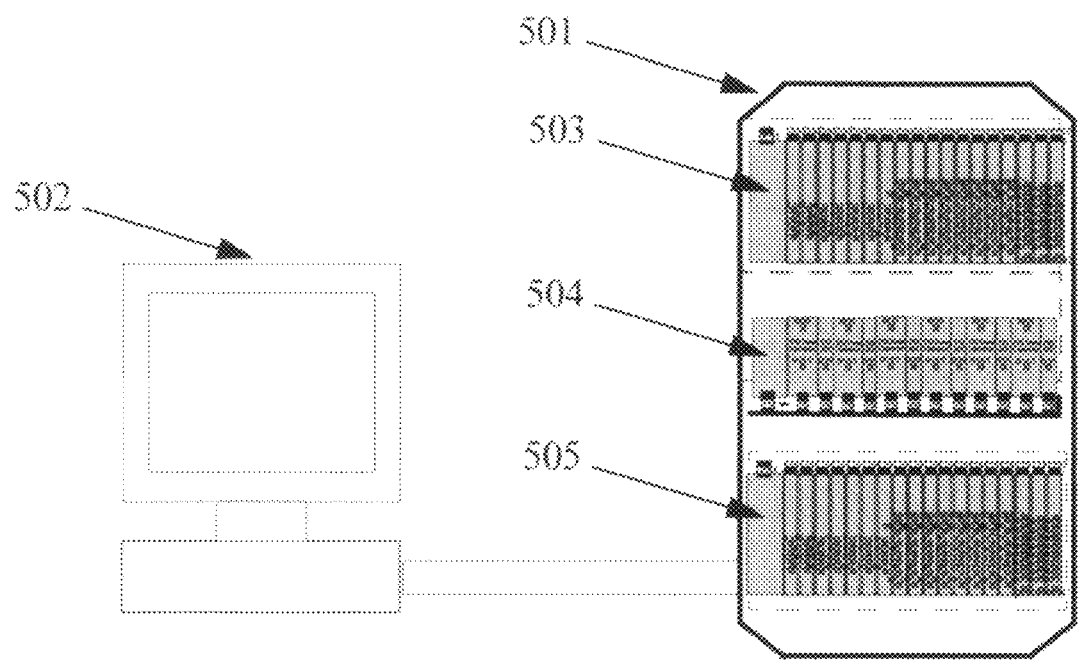
Figure 6:
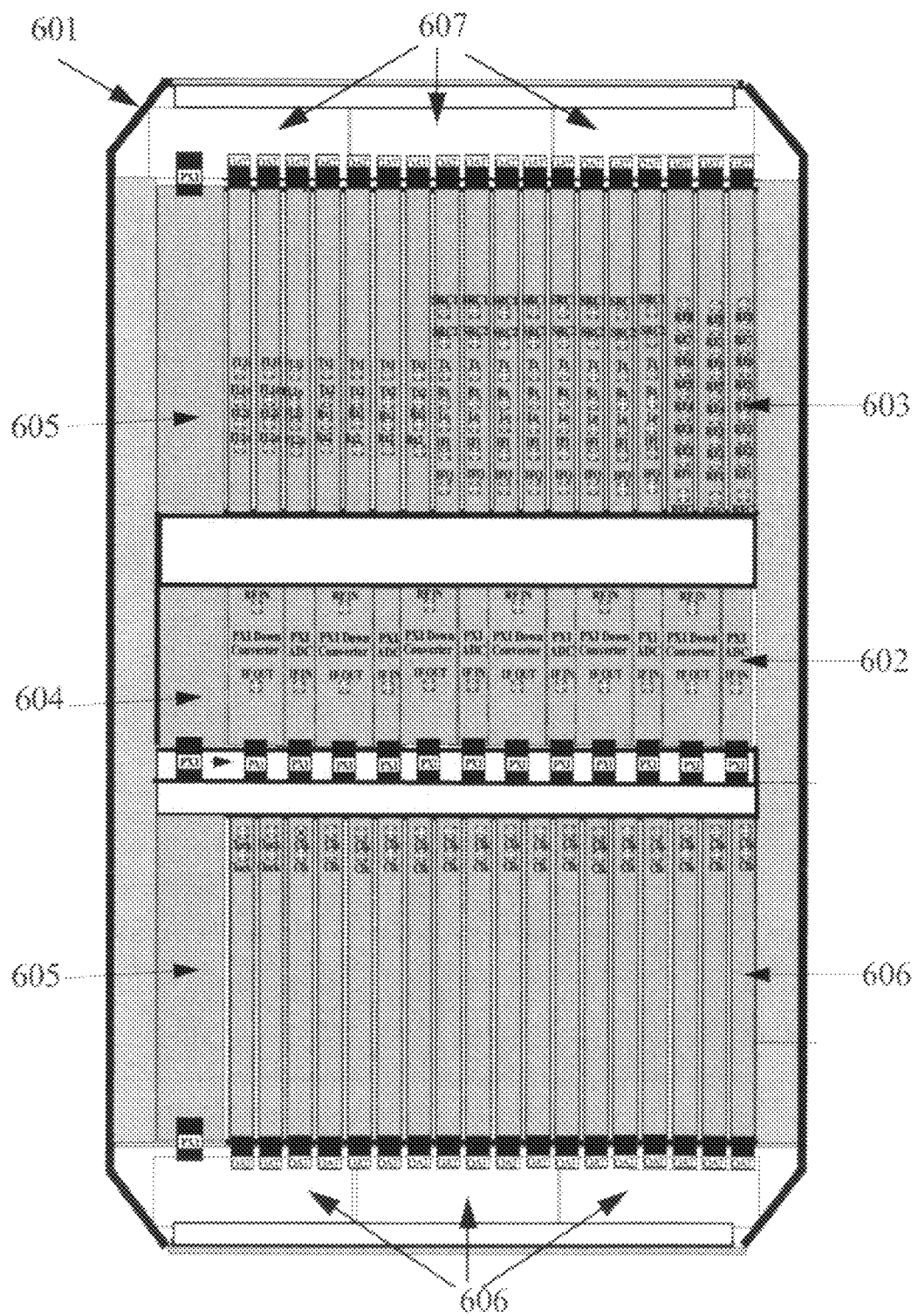
FIG. 6 Typical Traditional Tester with Computer Drawing of unified testhead (rear view)

FIG. 5 Shows one possible embodiment of the unified testhead, in this case with RF capability. The unified testhead/ comprises chassis assembly 501 into which multiple racks or slots are fitted. This example shows three rows of slots into which electrical test modules or boards may be located. In the example shown, upper and Lower rows 503 and 505 contains a mixture of 6u height PXI electrical test modules or boards, whereas middle row 504 contains a mixture of PXI electrical test modules or boards of 3u height. The mixture of electrical test modules or boards in racks 503, 504, 505 may be RF, microwave, analog, power supply, digital, optical, control, or electromagnetic in whatever combination is required. In the example shown the unified testhead 501 is connected to external computer 502 for control or test date management. FIG. 6 Shows a rear view of the unified testhead tester. In this example the tester chassis 601 houses three rows of electrical test modules or boards, the upper row containing power supply 605, and radio frequency (RF) electrical test modules or boards 603, the middle row containing power supply 604, and a variety of PXI electrical test modules or boards 602. and the lower row containing power supply 605, and digital and analog electrical test modules or boards 606. The height and quantity of rows may be varied, likewise any combination of module types may be used in each row. In this example cooling is achieved by inlet fans 606, and exhaust fans 607 though configuration may vary according to cooling needs.

Figure 7:
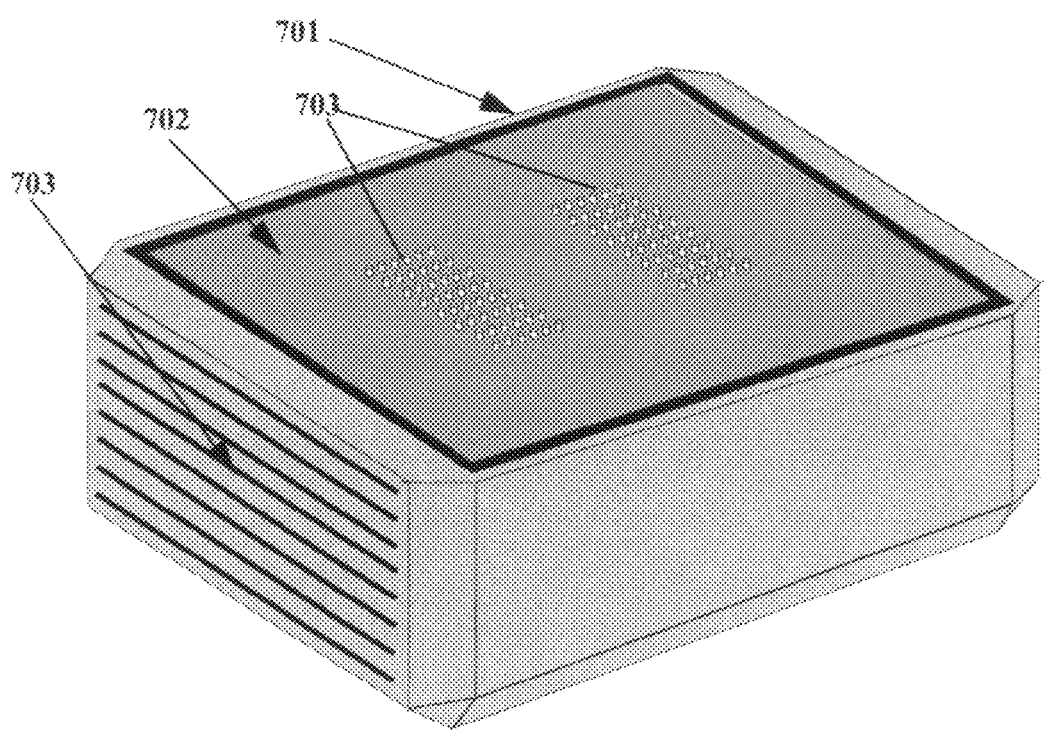

FIG. 7 is a 3-D drawing showing one possible embodiment of the unified testhead tester described in FIG. 6. Tester housing 701 contains the electrical test modules or boards and power supplies. These electrical test modules or boards are then connected via interposer 702 using double-sided connectors 703 which are then provided on the top-side of the interposer 702 as the interface to any external load-board (not shown for simplicity) where the DUT would be located. Cooling for test electrical test modules in this embodiment is provided via cooling vents 704. The reverse card backplane is a crucial element in the tester because it enables standard backplanes and 3rd party electrical test modules or boards to be leveraged, yet provides the versatility necessary to produce a highly flexible integrated, open architecture tester. In prior approaches tester boards or modules would be plugged into a standard backplane structure, because of this access one side of the module is obstructed by the backplane. Some standards (such as PXI) have provision for user-connectors, however these are low frequency connectors and as such are unsuitable for radio frequency (RF) or high speed digital applications.

By using a reverse Card backplane it is now possible to attach any desired form of connector to the rear of the electrical test modules or boards, making this interface scheme highly suited to radio frequency (RF) or high speed digital or date communication applications. Additionally because the reverse Card backplane uses a standard interface system PXI in the case shown) it is possible to interface with a standard backplane such as PXI, VXI or VME while still being able to make connections to all sides of the electrical test modules or boards.

Figure 8:
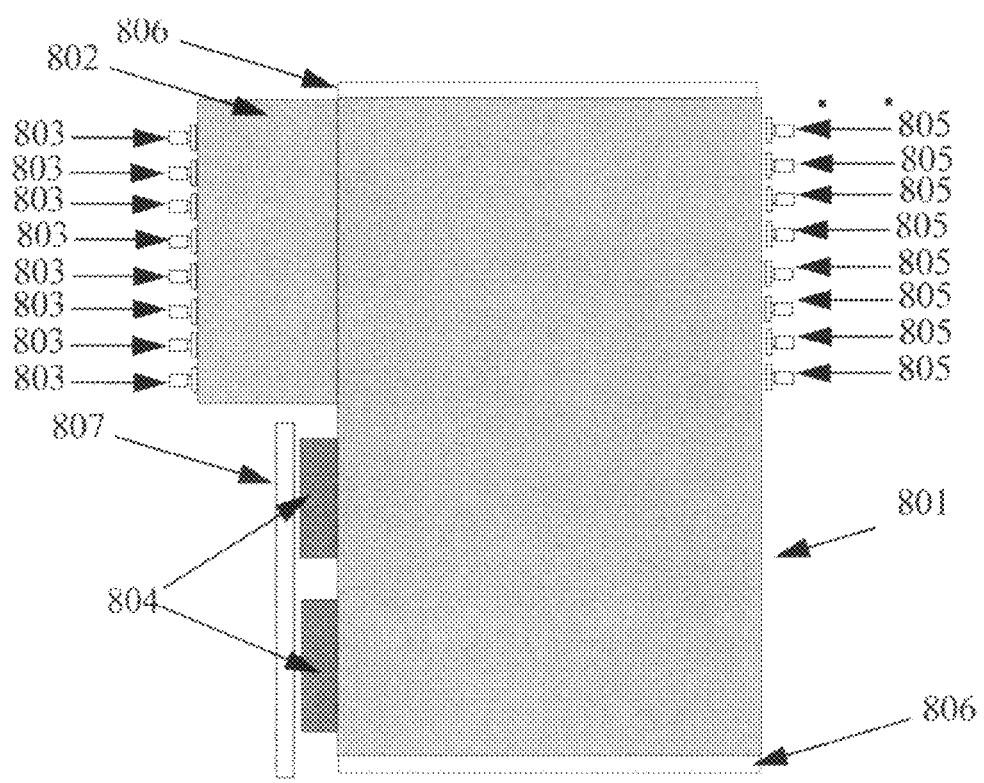
FIG. 8 Drawing showing an example of a reverse card backplane module used in tester.

FIG. 8 shows one possible example of the reverse Card backplane, 801 is the reverse card electrical test module or board which locates into the backplane via guides 806. Connection between the electrical test module or board or board 801 and the backplane 807 is via connectors 804, from there connection may be made to any interposer, load-board, DUT or tester circuitry. The reverse card electrical test module or board also may contain an extension piece 802 to carry electrical signals beyond the backplane connector 807 to connectors 803 again enabling connection to any interposer, load-board, DUT or circuity located behind the backplane 807.

Figure 9:
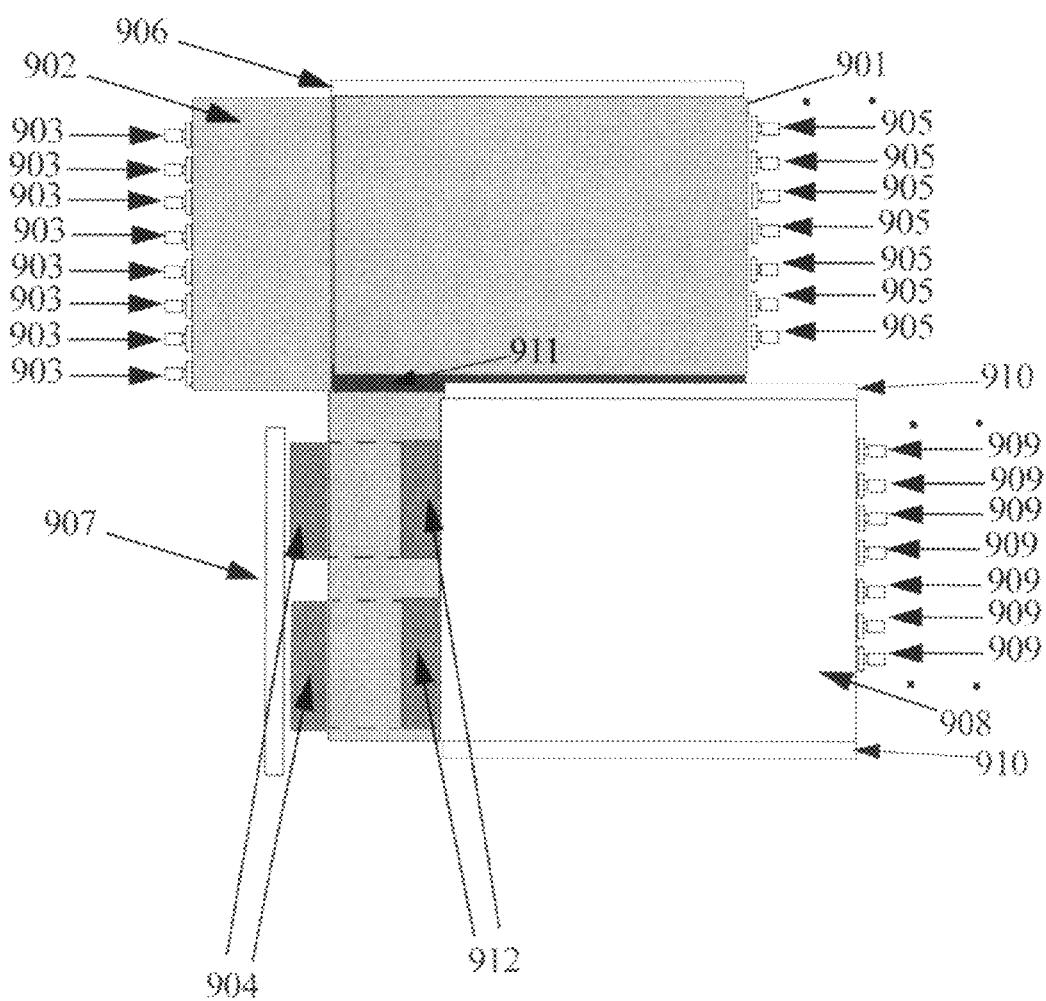
FIG. 9 Drawing showing an example of an adaptor reverse card backplane module used in tester.

FIG. 9 shows another possible example of the reverse Card backplane, in this embodiment it is used as an adaptor to allow reverse connectivity to a standard PXI module. The reverse card electrical test module, board or frame 901 has a card guide 906 on the upper side for backplane location. In the middle of the reverse card electrical test module, circuit board or frame is a card guide 911. Into the electrical test module, board or frame 901 is inserted the standard PXI module 908, where the card guide on the top side 910 is located in card guide 911 and on the lower side guide 910 guides the bottom of the entire assembly into the reverse card backplane. The standard PXI module 908 has backplane connectors 912 which connect onto the reverse card backplane connectors 904 to PXI backplane 907. Connection between the standard PXI electrical test modules or boards 908 and the reverse card test module, board, or assembly is between connectors 909 on the standard module and connectors 905 on the reverse card electrical test module, board or frame. The reverse card electrical test module, board, or frame may also contain an extension piece 902 to carry electrical signals beyond the backplane connector 907 to interposer connectors 903 thus enabling connection to any interposer, load-board, DUT, or circuitry located beyond the backplane 907. Further if a reverse card or module is used then additional circuitry could be contained therein to customize or enhance the functionality of the standard PXI module. The reverse card electrical test module, board, or frame could also be mirrored where necessary.

Figure 10:
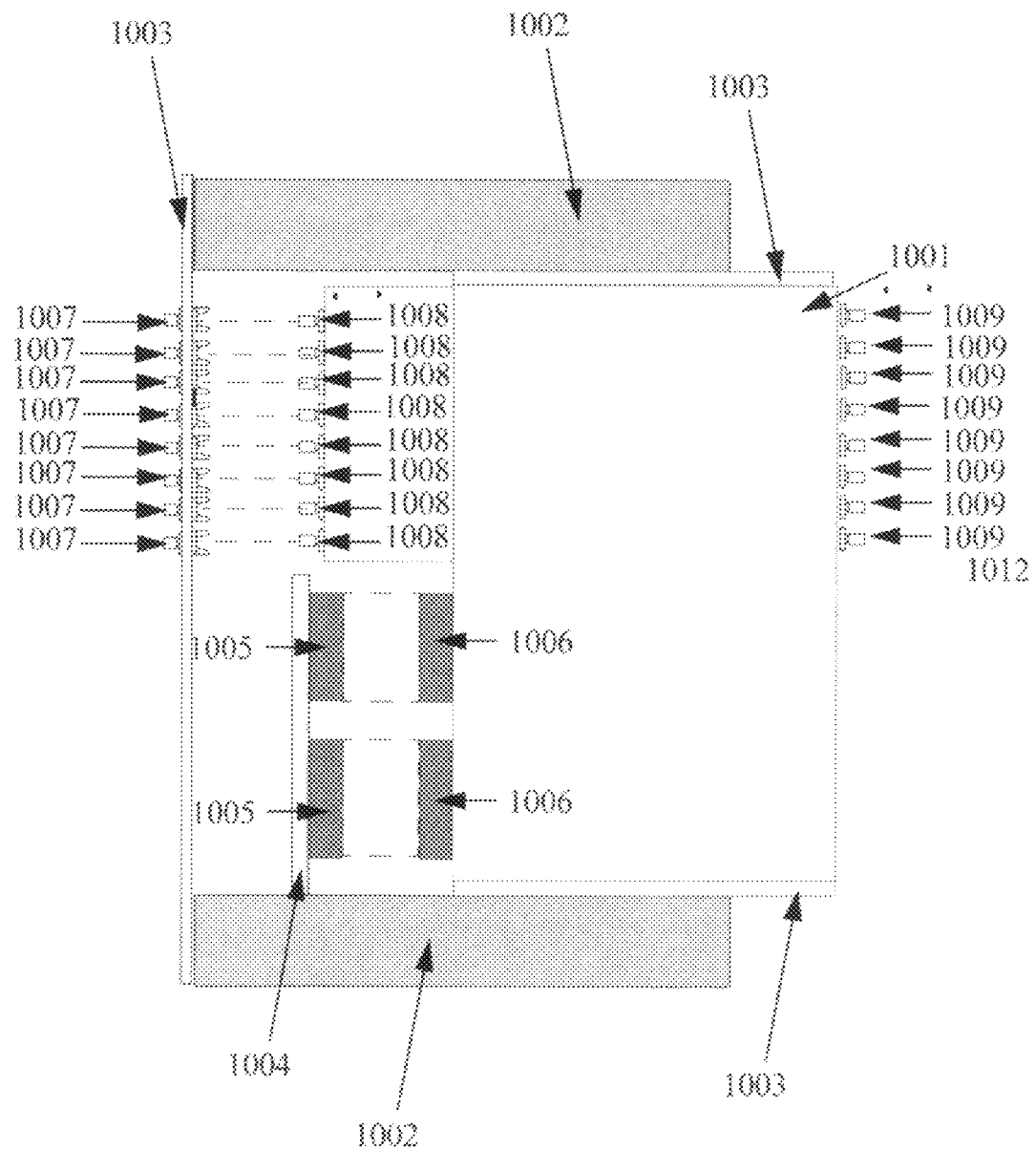
FIG. 10 Drawing showing a module being inserted into the reverse card backplane used in tester.

FIG. 10 shows another possible example of a reverse card backplane with electrical test modules, boards being inserted. Chassis 1002 houses the reverse card backplane 1004, and interposer 1003, it also has card guides 1003 to accept incoming card 1001. The reverse card circuit board 1001 has connectors 1006 which engage with backplane connectors 1005 and interposer connectors 1008 which engage with interposer connectors 1007 thus connectivity is possible with any load-board, DUT or circuitry. Thus circuit card 1001 may interface with both backplane 1004 and interposer 1003 on one side. The reverse card electrical test module, or board 1001 may also have electrical connections to other modules or user via rear connectors 1009.

Figure 11A:
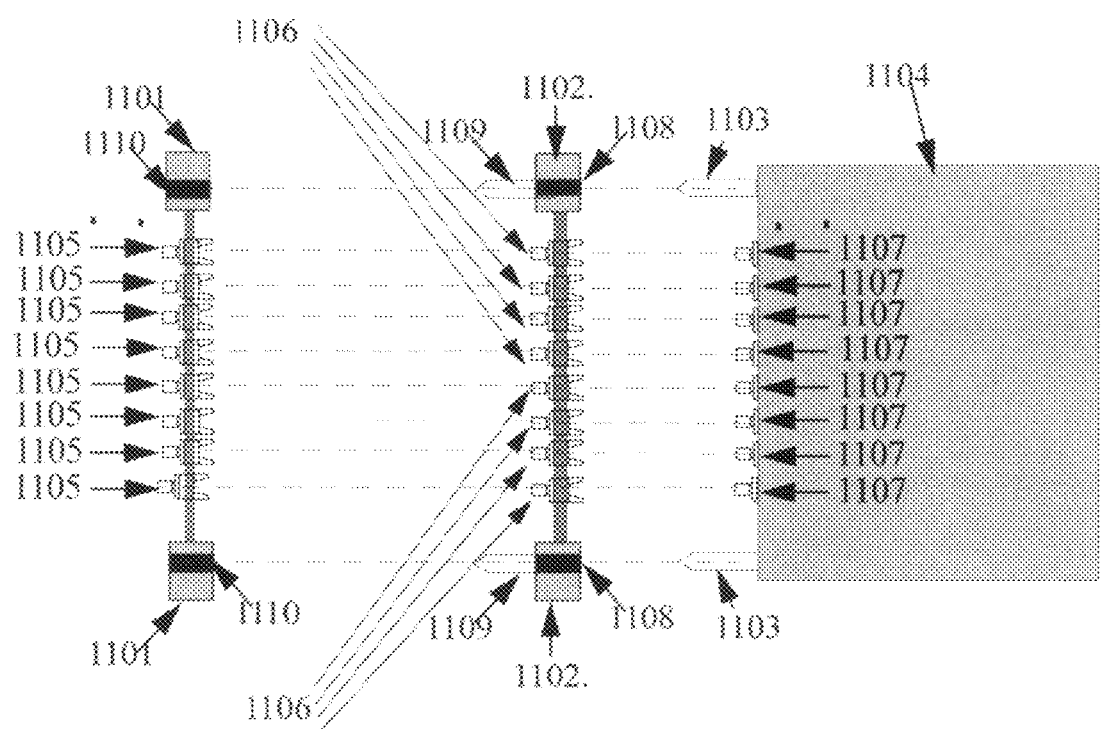
FIG. 11a Drawing showing an example RF direct coaxial interface used in tester
Figure 11B:
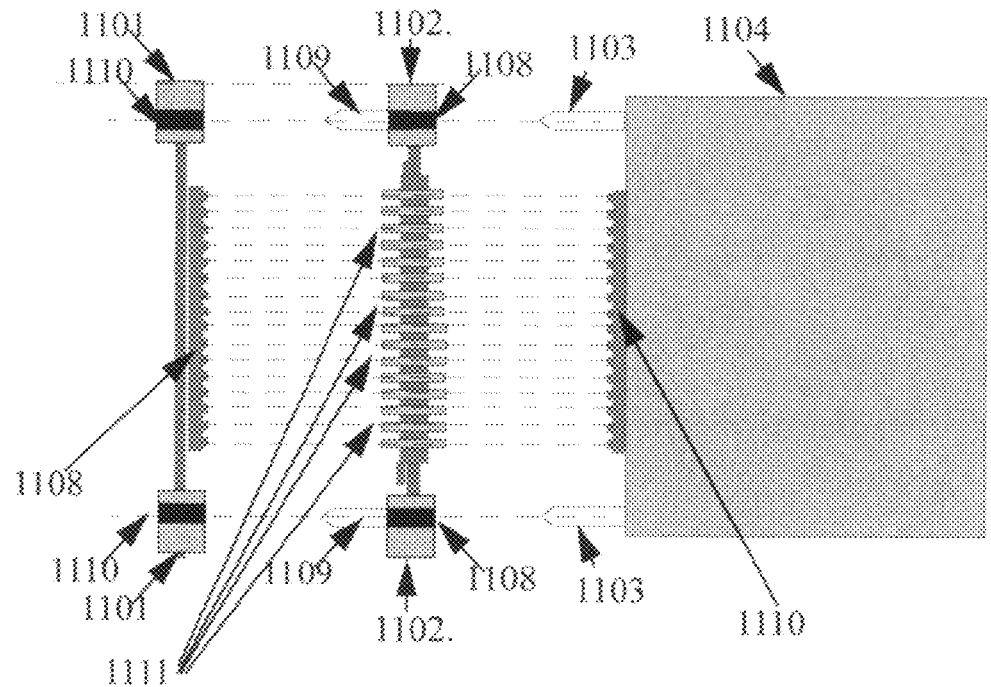
FIG. 11b Drawing showing example pogo variation of direct cable-less interface used in tester FIG. 11c Drawing showing example optical variation of direct cable-less interface used in tester FIG. 11d Drawing showing example magnetic variation of direct cable-less interface used in tester FIG. 12 Drawing showing example combining multiple direct interfaces used in tester FIG. 13 Drawing showing example of multiple direct coaxial interfaces used in tester FIG. 14 Drawing showing example top view of multiple direct interfaces used in tester FIG. 15 Drawing showing example top view of modular multiple direct interfaces used in tester FIG. 16 Diagram showing example of 2×2 micromachine relay switch matrix used in tester FIG. 17 Diagram showing 3×3 example of micromachine relay switch matrix used in tester FIG. 18 Diagram showing 4×4 example of micromachine relay switch matrix used in tester FIG. 19 Drawing showing example of one embodiment of micromachine relay switch matrix.
Figure 11C:
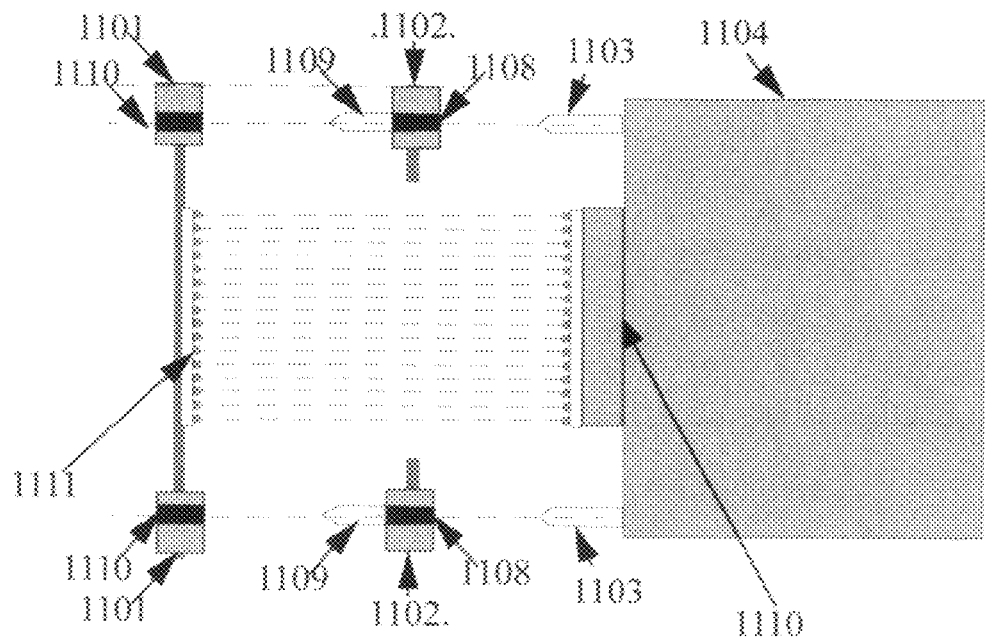
Figure 11D:
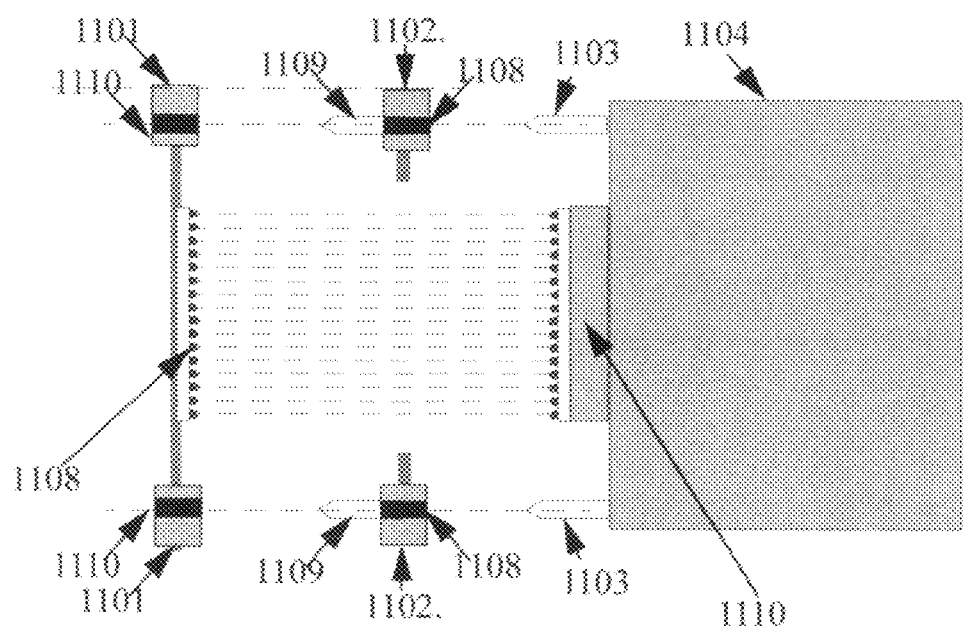

FIG. 11(a) Shows one example of a direct coaxial interface; electrical test module or circuit board 1104 which contains coaxial RF connectors 1107 is engaged with interposer 1102 and connectors 1107 engage with corresponding connectors 1106: Mechanical alignment is provided by guide pins 1103 which are attached to module 1104 and align with the interposer 1102 via alignment holes 1108. Likewise interposer 1102 is engaged with load-board 1101 and connectors 1106 engage with corresponding connectors 1105. Mechanical alignment is provided by guide pins 1109 which are electrical test attached to interposer 1102 and align with the load-board 1101 via alignment holes 1110.

The cable free interface leverages the direct coaxial interface concept and applies it to other connection methods such as pogo-pins, Electro-optical, elector-magnetic or any other type of connection where RF coaxial connectors are not used.

FIG. 11(*b*) Shows one example of a cable-free interface; electrical test module or circuit board 1104 which contains pogo contact pads 1110 is engaged with interposer 1102. The double-sided pogo connectors 1111 of the interposer 1102 then make electrical connection to pogo contact pads 1110 on electrical test module or circuit board 1104. Mechanical alignment is provided by guide pins 1103 which are attached to electrical test module or circuit board 1104 and align with the interposer 1102 via alignment holes 1108. Likewise load-board 1101 which contains pogo contact pads 1108 is engaged with interposer 1102. The double-sided pogo connectors 1111 of the interposer 1102 then make electrical connection to pogo contact pads 1108 on the load-board 1101 which houses the semiconductor or module device under test (DUT). Mechanical alignment is provided by guide pins 1109 which are attached to interposer 1102 and align with the load-board 1101 via alignment holes 1110.

FIG. 11(*c*) Shows one possible example of the cable-free interface; the electrical test module or board 1104 which contains opto-electronic sources and/or sensors 1110 is engaged with interposer 1102. The optical sources or sensors may be the actual devices under test (DUT), a part of the DUT, or electrically connected to the DUT via the load-board. Mechanical alignment is provided by guide pins 1103 which are attached to electrical test module or board 1104 and align with the interposer 1102 via alignment holes 1108. Likewise load-board 1101 which contains corresponding optical sensors and/or sources 1108. The optical sensors and or sources 1111 then make optical connection to the opto-electronic sources and/or sensors 1110. Mechanical alignment is provided by guide pins 1109 which are attached to interposer 1102 and align with the load-board 11101 via alignment holes 1110.

FIG. 11(*d*) Shows one possible example of the cable-free interface; electrical test board or module 1104 which contains electromagnetic sources and or sensors 1110 is engaged with interposer 1102. Mechanical alignment is provided by guide pins 1103 which are attached to the electronic test board or module 1104 and align with the interposer 1102 via alignment holes 1108. Likewise load-board 1101 which contains corresponding electromagnetic sensors and/or sources 1108. The electromagnetic sensors and/or sources 1111 then make electromagnetic connection to the electromagnetic sources and/or sensors 1110. Mechanical alignment is provided by guide pins 1109 which are attached to interposer 1102 and align with the load-board 1101 via alignment holes 1110.

Figure 12:
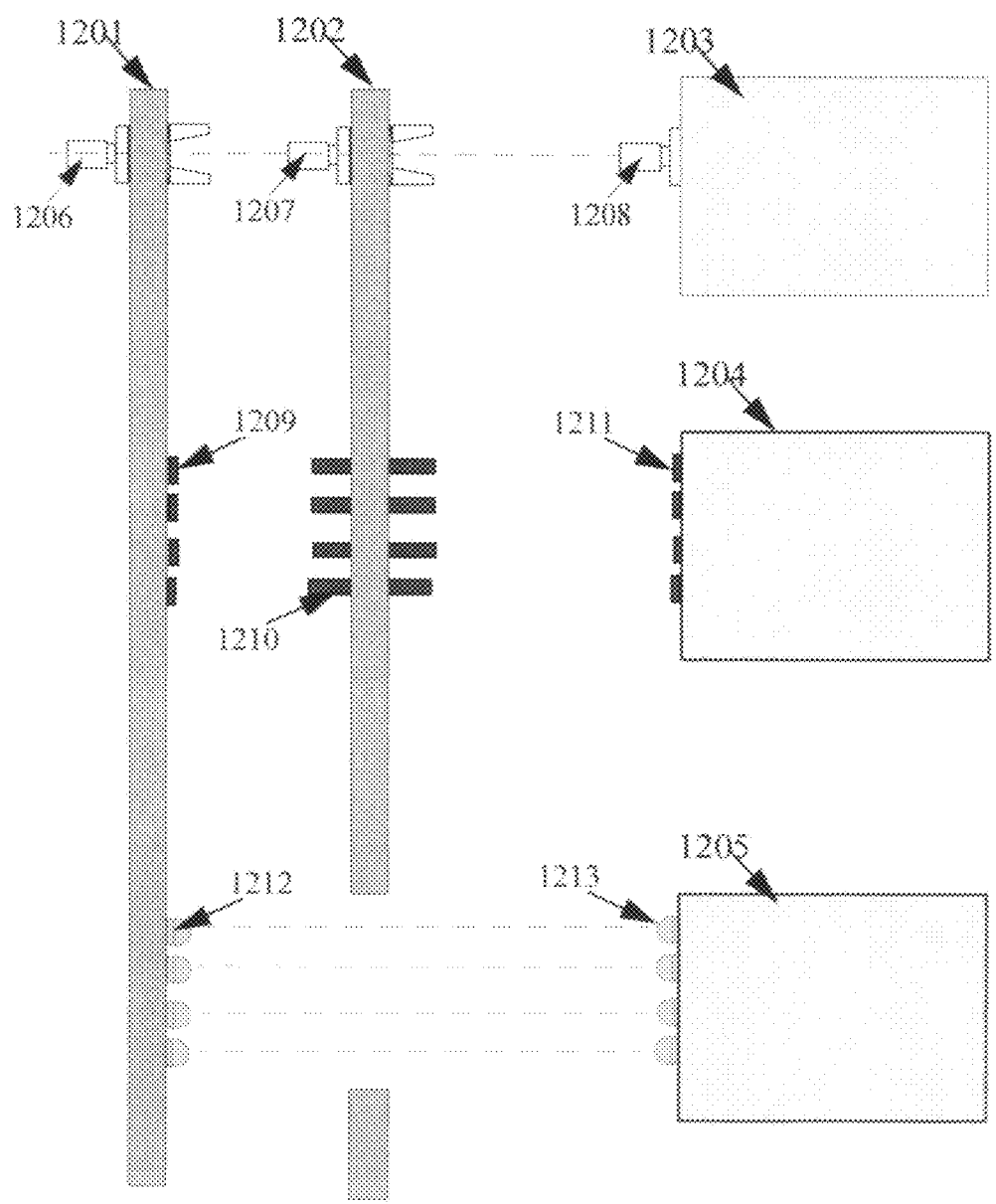

Because the direct coaxial and cable-free interface use similar techniques they may be combined to form a mixed signal test interface providing flexibility and good signal integrity. FIG. 12 is a drawing showing one possible embodiment combining the coaxial and cable-free interface, this is intended by way of an example not by limitation. In this particular embodiment the RF electrical test board or module 1203 uses coaxial connectors 1208, whereas the digital electrical test module or board 1204 uses pogo contact pads 1211, and electro-optical module 1205 electro-optical sensors and or sources 1213. For the RF electrical test board or module 1203 the signal is connected to the interposer via RF connector 1208 and 1207 respectively. For digital testing the electrical board or module 1204 the signals are connected to the interposer via pogo contact pads 1211 which mate with double-sided pogo-pins 1210 respectively. For the electro-optical module 1205 there is a cut-out in the interposer permitting the electro optical signals to pass directly to the electro-optical sensors and/or sources 1212 on the load-board 1201. The digital signals are connected between the interposer 1202 and load-board 1201 via double-sided pogo-pins 1210 mating with pogo contact pads 1209. The RF signals are connected between the interposer 1202 and the load-board 1202 via RF connector 1207 mating with RF connector 1206. For simplicity mechanical alignment is not shown but any method of aligning the modules 1203/1204/1205, interposer 1202 and load-board 1201 to a tolerance better than 0.02"accuracy would suffice.

Figure 13:
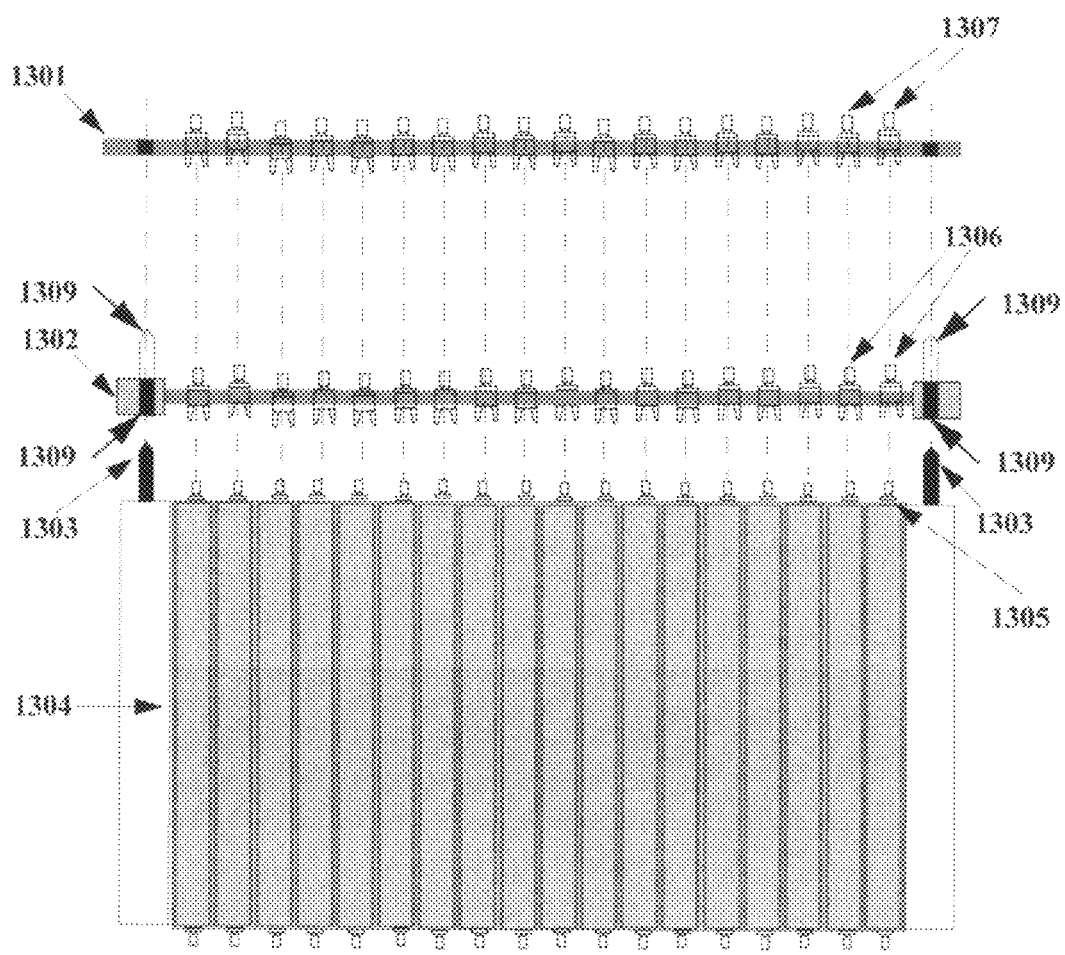

FIG. 13 is a drawing showing a top view of one possible embodiment of the direct coaxial interface, each RF electrical test module or board 1304 has one or more RF connectors 1305 mounted on the rear of an electrical test board or module. RF connectors 1305 mate directly with the RF connector 1306 which are mounted on the RF backplane/interposer 1302. The RF connectors 1306 on the interposer/RF backplane 1302 then connects to RF connectors 1307 mounted on the load-board 1301. Thus a direct coaxial path is established between modules 1304 and load-board 1301. Connector 1307 may pass through the load-board as shown, or it may terminate into microstrip, stripline, coaxial cable, or waveguide within the load-board 1301. From the load-board connectivity can be made to any module or device under test (DUT). In the embodiment shown the connectors 1306 and 1307 shown are both catchers-mitt types to help alignment when the electrical test module or board 1304 is plugged into the backplane 1302, or when the load-board 1301 is attached to the backplane 1302. Mechanical alignment between the electrical test module or board 1304 and RF backplane and or interposer 1302 is provided by guide pins 1303 which are attached to the RF electrical test module or board 1304 and align with the interposer 1302 via alignment holes 1308. Mechanical alignment between interposer and or RF backplane 1302 and load-board 1301 is provided by guide pins 1309 which are attached to the interposer 1302 and align with the load-board 1301 via alignment holes 1310.

Figure 14:
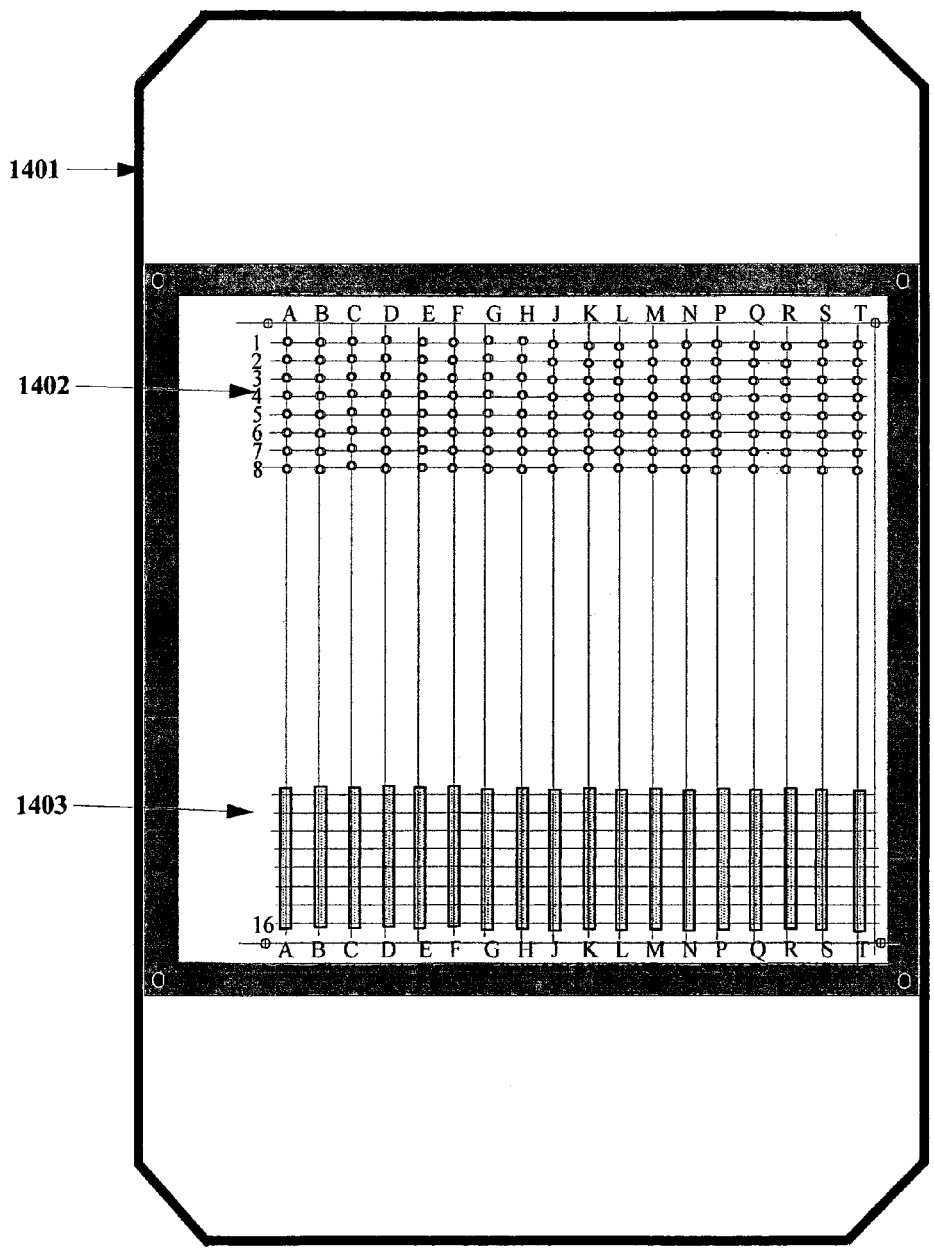

FIG. 14 is a top view drawing of the embodiment of the direct coaxial interface and cable-free interface with RF backplane and or interposer fitted described earlier in FIGS. 13 and 12 respectively. The chassis assembly 1401 houses interposer 1402 which contains a set of direct coaxial interface coaxial connectors 1403 and the cable-free interface in the form of double-sided pogo pins 1404. From this it can be seen the large quantity of interconnects between the electrical test module or boards and any interposer, load-board and or DUT is possible.

Figure 15:
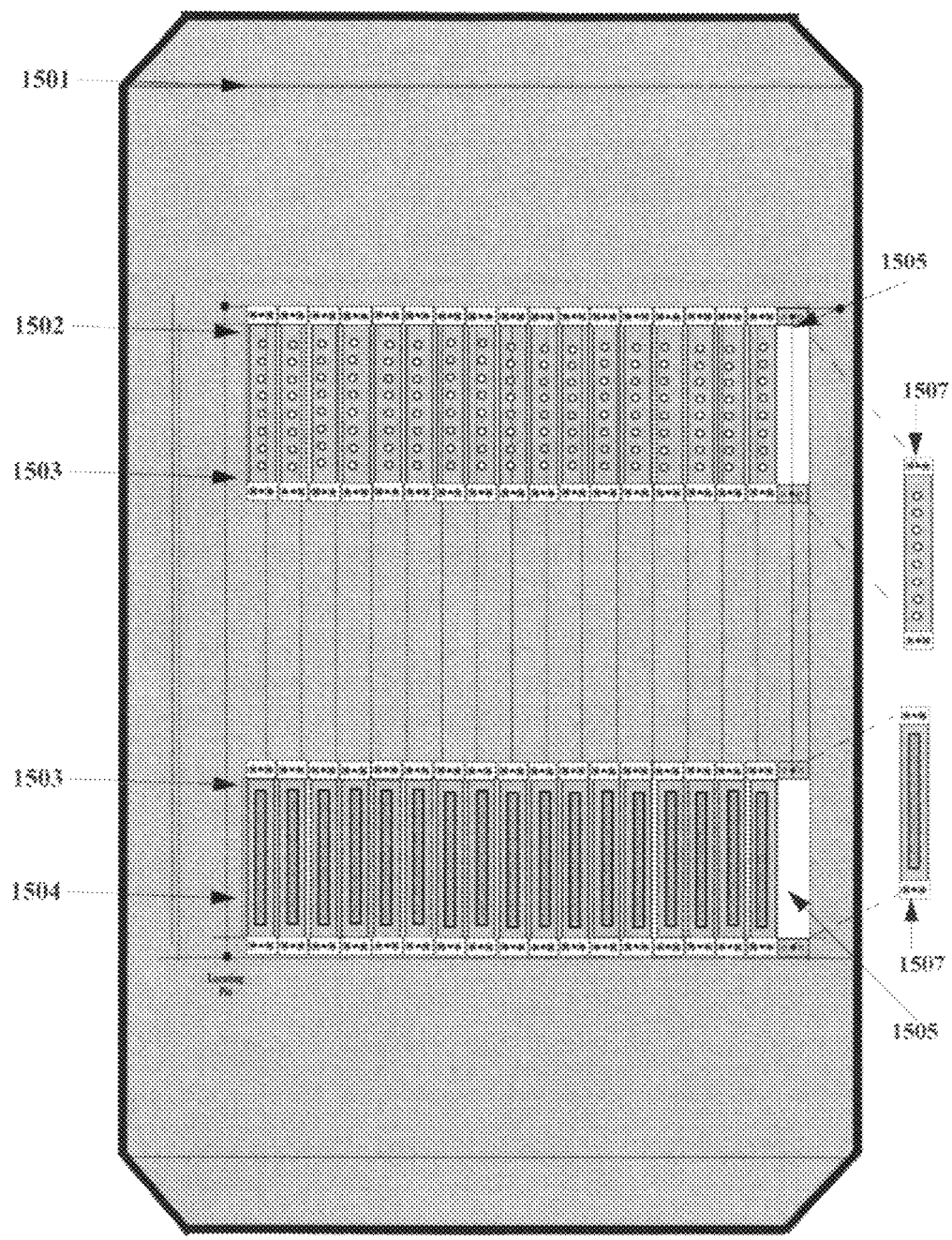

FIG. 15 is a top view drawing of the embodiment of the direct coaxial interface and cable-free interface with RF backplane and or interposer removed. The chassis assembly 1501 has two rows of electrical test boards or modules fitted. In the top row there are RF electrical test modules or boards 1502 fitted, whereas in the bottom row there are digital electrical test modules or boards 1504 fitted. To the right of each row of modules the drawing shows an empty slot 1505, with the respective modules 1502 and 1504 removed.

This invention has the capability to utilize micromachine technology in an ingenious way to form an RF crosspoint switch matrix which enables any number of electrical test modules or boards to be switched to any number of devices under test (DUT) and or calibration sites without significantly degrading tester performance. The prior art approach has been to either use dedicated electrical test module or board for each test site which gives very limited test capability, or in the case of my earlier U.S. Pat. No. 6,700,396 B1 micromachine relays were utilized only to isolate the electrical test module or board from the DUT or to sum in a central resource again lacking flexibility. The only prior art approach that gives this level of flexibility uses conventional relay technology to form a switch matrix between a number of electrical test boards or modules and devices under test (DUT) sites. The problem with this is that it requires large cable lengths and the physical dimensions are large adding stray capacitance and electrical length which degrade the test performance. However with the micromachine switch matrix approach, because of the very small size of the micromachine relay the electrical parasitics are low, making it possible to fabricate microwave multi-way switch matrices capable of high bandwidths yet giving excellent signal quality.

Figure 16:
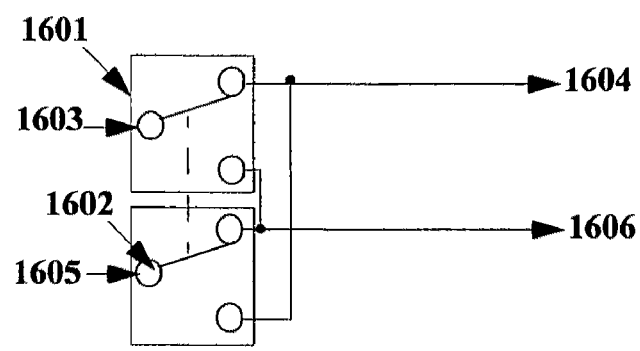

FIG. 16 shows one possible embodiment of the micromachine RF matrix, this is a method of switching high-performance, high-density radio frequency (RF) signals for test and measurement applications. RF electrical test boards or modules 1603 is connected to a micromachine relay 1601 where it can either be routed to DUT port 1604 or to DUT port 1606. Likewise signal electrical test boards or modules 1605 is connected to a micromachine relay 1602 where it can either be routed to DUT port 1604 or to DUT port 1606. These DUT ports may be used in many possible ways, one example would be switching between test sites, another would be connection to a common calibration port or connection to the DUT.

Figure 17:
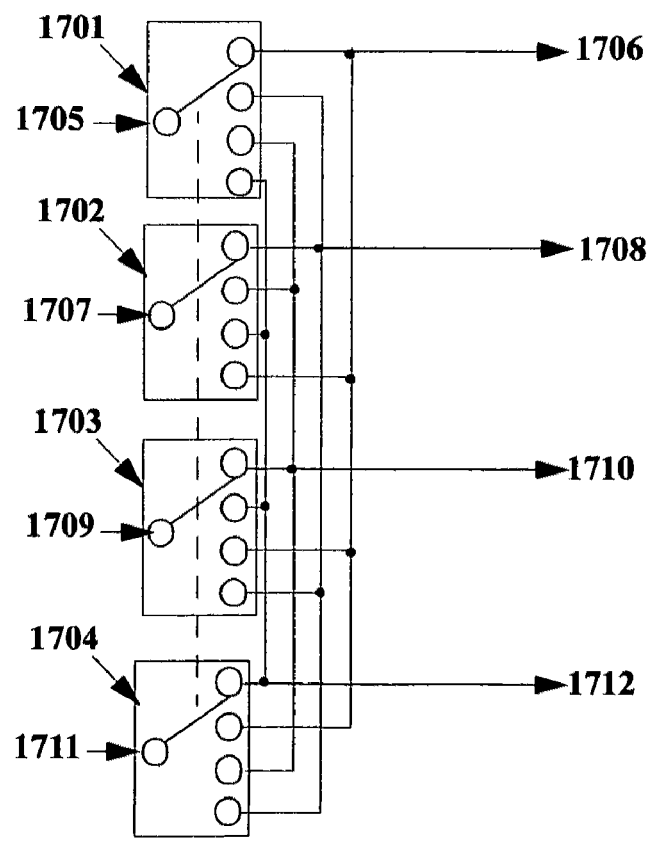

FIG. 17 shows another possible embodiment of the micromachine RF matrix. RF electrical test board or module 1705 is connected to a micromachine relay 1701 where it can either be routed to DUT port 1706, 1708, 1710, or 1711. Likewise RF electrical test boards or modules 1707 is connected to a micromachine relay 1702 where it can either be routed to DUT port 1706, 1708, 1710, or 1711. Similarly RF electrical test board or module 1709 is connected to a micromachine relay 1703 where it can either be routed to DUT port 1706, 1708, 1710, or 1711. Likewise RF electrical test board or module 1711 is connected to a micromachine relay 1704 where it can either be routed to DUT port 1706, 1708, 1710, or 1711. These DUT ports may again be used in many possible ways, one example would be switching between test sites, another would be connection to a common calibration port or connection to the DUT. This concept can be scaled up to build RF switch matrices of almost any electrical test boards or modules and DUT sizes e.g. 8×4, 8×8, 4×16 etc.

Figure 18:
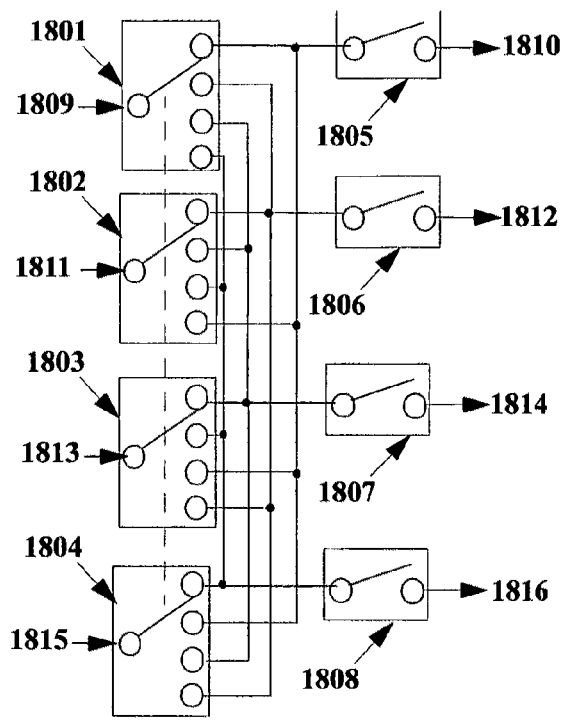
Figure 19:
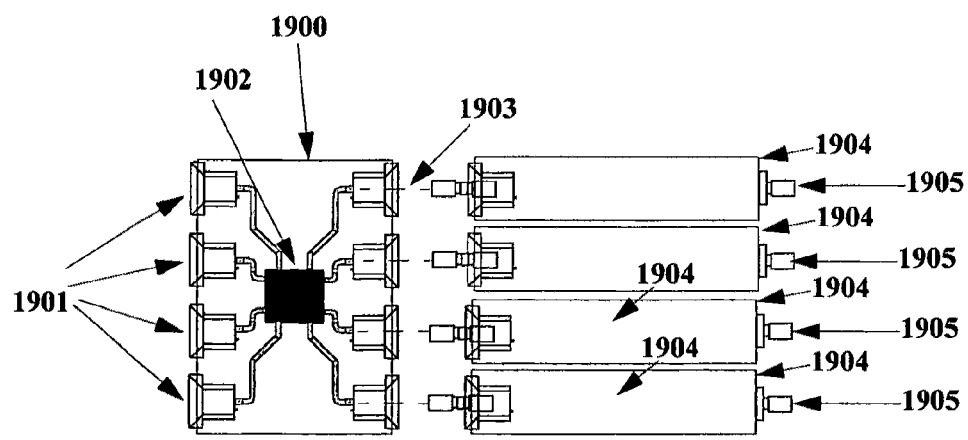

FIG. 18 Shows another possible embodiment of the micromachine switch matrix where the matrix is used to form a loopback connection. RF electrical test board or module 1809 is connected to a micromachine relay 1801 where it can either be routed to DUT port 1810 via micromachine relay 1805, or to DUT port 1812 via micromachine relay 1806, or to DUT port 1814 via micromachine relay 1807 or to DUT port 1816 via micromachine relay 1808. Likewise RF electrical test board or module 1811 is connected to a micromachine relay 1802 where it can either be routed to DUT port 1810 via micromachine relay 1805, or to DUT port 1812 via micromachine relay 1806, or to test port 1814 via micromachine relay 1807 or to DUT port 1816 via micromachine relay 1808. Similarly RF electrical test board or module 1813 is connected to a micromachine relay 1803 where it can either be routed to DUT port 1810 via micromachine relay 1805, or to DUT port 1812 via micromachine relay 1806, or to DUT port 1814 via micromachine relay 1807 or to DUT port 1816 via micromachine relay 1808. Likewise RF electrical test board or module 1815 is connected to a micromachine relay 1804 where it can either be routed to DUT port 1810 via micromachine relay 1805, or to DUT port 1812 via micromachine relay 1806, or to DUT port 1814 via micromachine relay 1807 or to DUT port 1816 via micromachine relay 1808. Alternatively relays 1805, 1806, 1807, and 1808 can be opened to provide extra isolation. Furthermore relays 1805, 1806, 1807, and 1808 can be opened and electrical test boards or modules 1809, 1811, 1813, and 1815 may be connected to each other to provide a loopback capability which has many possible uses including calibration and self-test. FIG. 19 is a drawing showing one possible physical embodiment of the micromachine relay matrix, described in FIG. 18, here a 4×4 isolating micromachine relay switch matrix 1902 is mounted in an assembly 1900 such that it can switch between multiple RF electrical test boards or modules via connections 1903 and to the interposer and or device under test (DUT) via connectors 1901. In this embodiment RF electrical test module or boards 1904 are directly connected to the micromachine relay assembly 1900 via RF connectors 1903.

Figure 20:
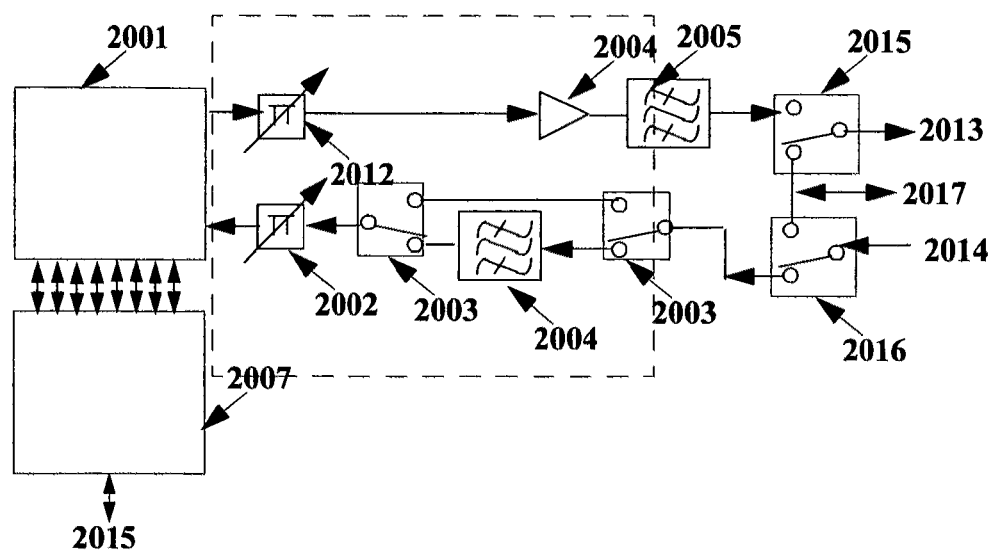
FIG. 20) Diagram showing example of device specific module with transceiver ports used in tester FIG. 21) Diagram showing example of device specific module with combined transceiver port.

FIG. 20 shows block diagram of one possible embodiment of a device specific module. In this embodiment the control and interface FPGA/CPLD 2007 generates a pseudorandom test signal which is fed to a golden transceiver 2001 which is specific to the family of devices under test (DUT). The transceiver 2001 provides a transmit RF signal which is fed to variable attenuator 2012 then to transmit amplifier 2004 where the power is amplified, the amplified signal is then fed to signal conditioning filter 2005 producing a transmit signal that is spectrally clean with variable amplitude. The signal is then fed to parametric isolation switch 2015, this then connects the signal to the device under test (DUT) port 2013, or it connects to the DUT port 2013 to the parametric measurement path 2017 where additional electrical test board or module may be connected for measuring other parameters such as low speed DC leakage. The receive DUT port 2014 takes an incoming signal from the device and feeds it to the parametric isolation switch 2016, this then either connects the signal conditioning selection switch 2003, or it connects the additional electrical test board or module path 2017 where additional electrical test boards or modules may be connected for measuring other parameters such as low speed DC leakage. The signal conditioning selection switch 2003 selects either a direct signal path or via filter 2004 to the receive attenuator 2002, then to the receive port of the transceiver 2001. A output or representation of the transceiver output is then fed to the control fpga 2007 where it may be compared to the transmitted waveform for bit error rate determination. Alternatively the digital portion of the device under test (DUT) can be connected to tester digital electrical test module or boards and the device specific module can be controlled and/or date loaded/received via interface port 2015.

Figure 21:
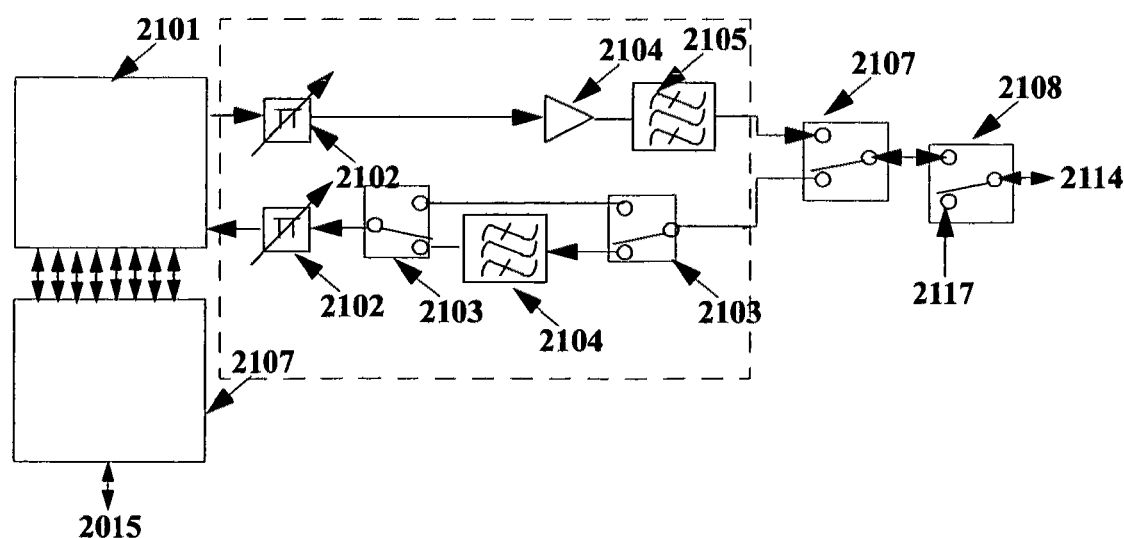

FIG. 21 shows block diagram of another possible embodiment of the device specific module. In this embodiment the control and interface FPGA/CPLD 2107 generates a pseudorandom test signal which is fed to a golden transceiver 2101 which is specific to the familiy of devices to be tested. The transceiver 2101 provides a transmit RF signal which is fed to variable attenuator 2112 then to transmit amplifier 2104 where the power is amplified, the amplified signal is then fed to signal conditioning filter 2105 producing a transmit signal that is spectrally clean with variable amplitude. The signal is then fed to transmit/receive switch 2107 which routes either the transmit signal to the parametric isolation switch 2108, or the receive signal from the parametric isolation switch 2108 to the receive signal conditioning switch 2103 which is described later. The parametric isolation switch 2108 then either connects the signal to the device Under Test (DUT) port 2013, or it connects the device under test (DUT) port 2013 to the parametric measurement path 2017 where additional electrical test boards or modules may be connected for measuring other parameters such as low speed DC leakage. The Receive signal from the DUT port 2013 passes via the parametric isolation switch 2016 to the signal conditioning selection switch 2103 selects either a direct signal path or via filter 2104 to the receive attenuator 2102, then to the receive port of the transceiver 2101. A digital output or representation of the transceiver output is then fed to the control fpga 2107 where it may be compared to the transmitted waveform for bit error rate determination. Alternatively the digital portion of the device Under Test (DUT) can be connected to digital electrical test module or board and the device specific module can be controlled and/or date loaded/received via interface port 2115.

Figure 22:
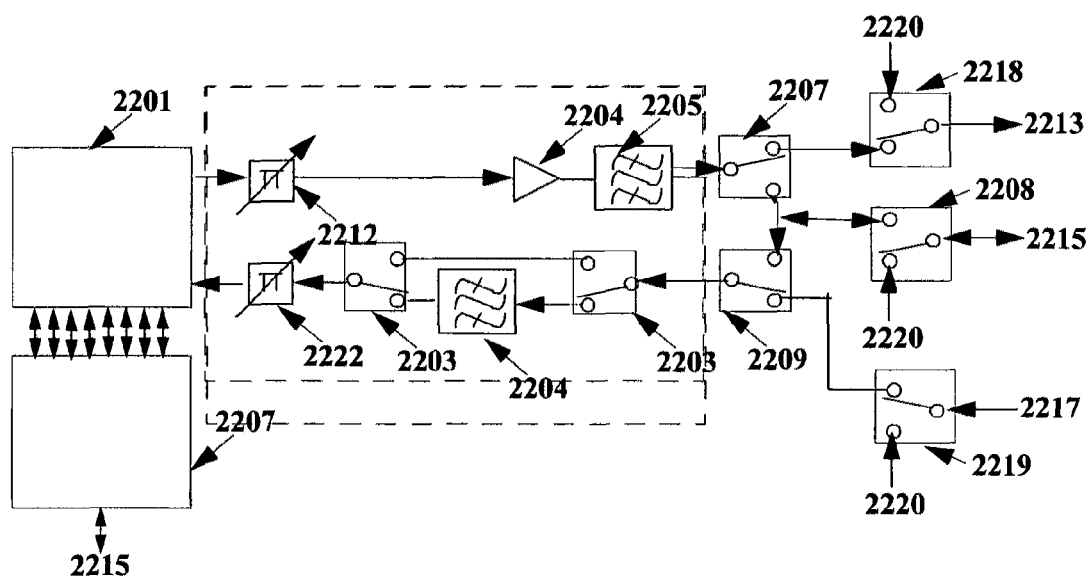
FIG. 22 Diagram showing example of device specific module with multi transceiver ports FIG. 23 Diagram showing example of remote date-communications testing apparatus

FIG. 22 shows block diagram of another possible embodiment of the device specific module. In this embodiment the control and interface FPGA/CPLD 2207 generates a pseudorandom test signal which is fed to a golden transceiver 2201 which is specific to the familiy of devices to be tested. The transceiver 2201 provides a transmit RF signal which is fed to variable attenuator 2212 then to transmit amplifier 2204 where the power is amplified, the amplified signal is then fed to signal conditioning filter 2205 producing a transmit signal that is spectrally clean with variable amplitude. The signal is then fed to transmit loopback switch 2207, this then either connects the signal to the parametric isolation switch 2218, or it connects to the receive loopback switch 2209 and the parametric isolation switch 2208 which either passes the signal to the DUT port 2214, or it connects the DUT port 2214 to the parametric port 2220 where additional instruments may be connected for measuring other parameters such as low speed DC leakage. The device under test (DUT) receive signal may either received via port 2217 in which case it would be fed to parametric isolation switch 2219 which either passes via receive port select switch 2209 to the signal to the receive filter select switch 2203, or it connects the DUT port 2217 to the parametric port 2220 where additional electrical test board or module may be connected for measuring other parameters such as low speed DC leakage. The receive signal may also be fed into port 2014 in which case it is fed to parametric isolation switch 2208 which either passes the signal via receive port select switch 2209 to the receive filter select switch 2203, or it connects the DUT port 2217 to the parametric port 2220 where additional electrical test board or module may be connected for measuring other parameters such as low speed DC leakage. The signal conditioning selection switch 2203 selects either a direct signal path or via filter 2204 to the receive attenuator 2202, then to the receive port of the transceiver 2001. A digital output or representation of the transceiver output is then fed to the control fpga 2007 where it may be compared to the transmitted waveform for bit error rate determination. Alternatively the digital portion of the device under test (DUT) can be connected to tester digital electrical test module or board and the device specific module can be controlled and/or date loaded or received via interface port 2015.

The universal remote measurement system for high speed datacom contains a method of building a universal test instrument with a remote measurement head for working in the tester described herein giving high performance. But because of the unique design it could possibly be extended to a universal concept for use and across many other platforms. For example in the field of high speed datacom testing, only the critical instrumentation needs to be mounted on the loadboard, or testhead giving excellent performance, small size, and makes it possible to provide high speed datacom testing on many different semiconductor test platforms. Prior art is that there is only two tester companies that can make high speed datacom test sets for their systems, these measurement units are specific to those testers and so there are many tester manufacturers who do not have the test capabilities to test high speed date communication devices on their systems. This invention is a method to produce a universal high speed date communication test system capable of date rates exceeding 5 gigabits per second that could be used on a variety of different test systems. At present no such unit exists. One possible embodiment of this invention would be to have a small testhead mounted unit that provides the critical high speed critical signal conditioning, and a base unit that does the control and date generation. Another possible Embodiment of this invention would be wherein the testhead mounted unit is located upon the load-board thereby providing better signal integrity and reducing the electrical length between the unit and device under test (DUT).

Figure 23:
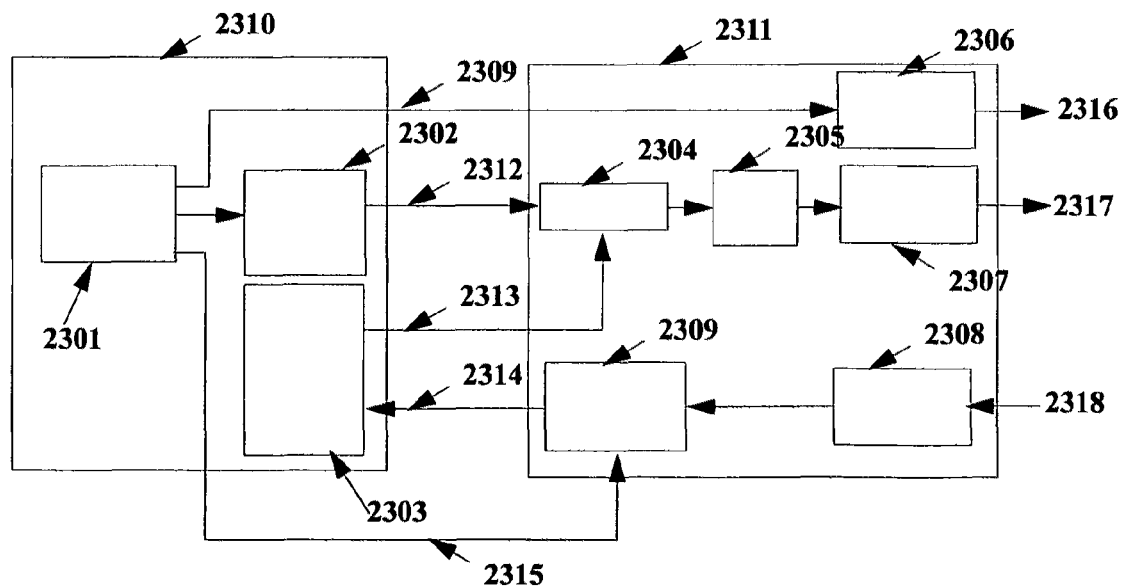

FIG. 23 shows one possible embodiment of the universal remote measurement system for high speed datacom which may be used in the tester described herein or in other test applications. The system consists of two sections; a mainframe based modules and or rack 2310 which houses the bulky components and instrumentation, and a small remote testhead-mounted unit 2311 which houses the critical electrical test board or module that needs to be close to the DUT. Mainframe 2310 houses a precision clock reference 2301, this generates the low jitter clock required by the system. A sample of this clock may be fed to the slave unit 2311 via a coaxial cable 2309 where it has output conditioning i.e. levels and direct current (DC) offset calibrated and adjusted to the required levels this is then fed to the device under test 2316. A second phase-coherent clock output is fed to the programmable jitter injection and phase shift unit 2302, here the date phase may be adjusted, and programmable jitter added to the clock waveform. This is then fed to the slave unit 2311 via a coaxial cable 2312 where it is used to clock the parallel to serial date converter 2304. Parallel date which is generated in the date generation and detection unit 2303 is fed via parallel cables to the parallel to serial date converter 2304 where it is converted into high speed serial date. The output of the parallel to serial date converter 2304 is fed to the optional jitter injection and skew unit 2305 which may add deterministic jitter or modulation if required. The output of jitter injection and skew unit 2305 is then fed to the transmit data conditioning unit 2307 where level, offset or DUTy cycle may be adjusted. From here date is fed to the device under test (DUT) 2317. Received date from date the device under test (DUT) 2318 is fed to the input conditioning 2308 where variable gain and offset may be applied. From there it is fed to the serial to parallel converter 2309 which converts this date back into a lower speed parallel form. The serial to parallel converter may contain clock and date recovery in which case it could be self-clocking or it can be clocked by the variable phase receive clock which is fed from precision clock 2301 via a coaxial cable 2315. The lower speed parallel date is then fed via the parallel cable 2314 to the date generation and detection unit 2303. Here it could be compared with the generated transmit clock date and a bit error rate (BER) calculated, processes, or recorded for future analysis.

The invention claimed is:
1. A chassis tester comprising:
a housing which contains an internal computing system,
alternating current (AC) power supplies,
a test interface configured to connect a Device Under Test (DUT),
slots to house a multiplicity of test boards,
a backplane configured to connect all boards,
a bridge device configured to connect a computer to the backplane,
electrical test modules configured to test the Device Under Test (DUT), and
an interposer configured to connect test boards to the Device Under Test (DUT);
wherein a distributed Radio Frequency (RF) stimulus is distributed to the Device Under Test (DUT); the distributed Radio Frequency (RF) stimulus comprises at least Radio Frequency (RF) signal sources and a signal splitter to replicate, convey and distribute multiple copies of the distributed Radio Frequency (RF) stimulus to one or more Devices Under Test (DUT).

2. The tester of claim 1, wherein the electrical test modules mate directly with the device Under Test (DUT) via the interposer without using cables thus forming a direct coaxial interface.

3. The tester of claim 1, wherein the electrical test modules mate directly with the Device Under Test (DUT) without using cables.

4. The tester of claim 1, wherein a direct pogo-pin, or electromagnetic, interface is used to provide a cable-free interface between the electrical test modules and a load-board or Device Under Test (DUT).

5. The tester of claim 1, wherein one or more reverse-card backplanes interfaces having a front surface and a back surface, are used to enable connection to both the backplane and to the Device Under Test (DUT) at the front surface.

6. The tester of claim 1, further comprising a multiplicity or modules or boards, some with backplane interfaces and others using the reverse card backplane interface of claim 5.

7. The tester of claim 1, wherein a combination of optical and electrical, or optical and electromagnetic test signals are connected between the electrical test modules and the Device Under Test (DUT).

8. The tester of claim 1, wherein an external computing device is connected to the tester.

9. The tester of claim 1, wherein power supply boards are located externally to the chassis tester.

10. The tester of claim 1, wherein external test instrumentation is connected to the chassis tester.

11. The tester of claim 1, further comprising a buffer amplifier.

12. The tester of claim 1, further comprising a micromachine RF switch configured to provide crosspoint switching between a multiplicity of electrical test modules and the Device Under Test (DUT).

13. The tester of claim 1, further comprising a device specific module comprising one or more radio frequency (RF) transceivers, a means of control via a tester, and means of conditioning transmit and receive signals configured to test the Device Under Test (DUT).

14. The tester of claim 1, further comprising a device for testing at gigabit date rates.

15. The tester of claim 1, wherein Radio Frequency (RF) signal sources are connected directly to the Device Under Test (DUT) via coaxial connectors without cables, and via a micromachine relay switch matrix which is mounted inline to provide crosspoint switching between the signal sources and the Device Under test (DUT).

16. The tester of claim 1, wherein Radio Frequency (RF) signal sources are connected directly to the Device Under Test (DUT) via coaxial connectors without cables, and digital control or test signals are connected directly to a loadboard or Device Under Test (DUT) without cables.

17. The tester of claim 1, wherein Radio Frequency (RF) signal sources are connected directly to the Device Under Test (DUT) via coaxial connectors without cables, and the electrical test modules have a control interface connector.

18. The tester of claim 1, wherein Radio Frequency (RF) signal sources are connected directly to the Device Under Test (DUT) via coaxial connectors without cables, and the electrical test modules have a control interface connector and a micromachine relay switch matrix which is mounted inline to provide crosspoint switching between the Radio Frequency (RF) sources and the Device Under test (DUT).

19. The tester of claim 1, wherein Radio Frequency (RF) signal sources are connected directly to the Device Under Test (DUT) via coaxial connectors without cables, and the electrical test modules have a control interface connector and a micromachine relay switch matrix which is mounted inline to provide crosspoint switching between the Radio Frequency (RF) sources and electrical test modules.

20. The tester of claim 1, wherein Radio Frequency (RF) signal sources are connected directly to the Device Under Test (DUT) via coaxial connectors without cables, and the electrical test modules have a control interface connector and digital control or test signals are also connected directly to a loadboard or Device Under Test (DUT) without cables.

* * * * *